United States Patent Office 3,521,183

Patented July 21, 1970

3,521,183

FREQUENCY SYNTHESIZER

Joseph Leostic, Le Mesnil-Saint-Denis, Yvelines, Lucian Babany, Le Blanc-Mesnil, Seine-St.-Denis, Roger Sassoon, Saint-Germain-les-Arpajon, Essone, and Antoine Poussin, Asnieres, Hauts-de-Seine, France, assignors to C.I.T.-Compagnie Industrielle des Telecommunications, Paris, France, a corporation of France Filed Jan. 12, 1968, Ser. No. 697,522
Claims priority, application France, Jan. 12, 1967, 90,951; Oct. 30, 1967, 126,416, 126,417
Int. Cl. H03b 3/04
U.S. Cl. 331—16 14 Claims

ABSTRACT OF THE DISCLOSURE

A wide band frequency synthesizer providing a spectrum of frequencies spaced by a constant quantification step $p$ in the form of an automatically functioning high stability generator of a spectrum of fixed frequencies in harmonic interrelationship, including a phase discriminator for providing synchronizing control.

The present invention relates in general to frequency generators and more particularly to an automatically controlled system for generating with high stability one frequency of a range of available frequencies.

Frequency generating systems are known wherein one frequency of a range of frequencies is obtained from an oscillator by sweeping the frequency range of the oscillator through application of a sawtooth voltage to a variable capacity diode or other similar element in the oscillator until the output frequency matches a reference frequency or a selected harmonic thereof in the available range as determined by means of a phase discriminator. The output of the phase discriminator is then used to terminate scanning and to control the oscillator so that the output thereof is phase-locked to the reference frequency.

However, there is a limit to the range of frequencies which may be derived from a single oscillator with stability and, in addition, a selective variation of the desired output frequency in the known systems is achieved with no little difficulty, usually requiring the replacement of the highly stable reference frequency source.

It is therefore an object of the present invention to eliminate or otherwise satisfactorily rectify the difficulties and disadvantages which have been heretofore experienced in connection with known frequency generating systems.

It is another object of the present invention to provide a frequency generating system capable of providing frequencies over an extremely wide range with stability.

It is a further object of the present invention to provide a frequency generating system which is capable of automatically providing any selected one of a wide range of frequencies with phase locked control thereover.

The subject of the invention is a frequency synthesizer with a range which can cover several octaves, using a plurality of oscillators each of which covers a partial band of the available spectrum, which synthesizer functions to scan the frequency of a selected oscillator until a desired frequency is reached, as determined by counting the harmonics of a reference frequency. The circuits of the said synthesizer are combined in such a way that when the operator has indicated on the dials of a control box the numerical value of the frequency desired, one of the said oscillators, selected automatically, is brought to the state of synchronization with a harmonic of a highly stable reference frequency, the said harmonic being itself selected automatically to lock-in on the said frequency desired, taking into account if necessary the value of a fixed intermediate frequency by which the desired frequency is to be corrected (either plus or minus as the case may be) to obtain the frequency which the synthesizer must effectively supply.

In its most general form, the system of the present invention includes $m$ variable oscillators covering a basic frequency range subdivided into $m$ partial frequency bands generated respectively by the said $m$ oscillators, and a plurality of operators supplying ranges derived by division and/or multiplication of frequency from the basic range, each derived range being also subdivided into $m$ partial bands. Thus, if there is a total of $n$ operators (including the operator "1" which supplies the basic range), the spectrum which is covered as a whole comprises $mn$ partial frequency bands. Preferably the dividers and multipliers of the operators are in geometric progression in the same ratio, designated below with the letter $r$, and the basic range has the same relative width $r$. As a result the partial frequency bands cover the totality of a given spectrum, without overlapping or leaving gaps. Thus, the available frequencies may be designated numerically in consecutive order, as will be described hereinafter.

The investigation of a new frequency indicated on the control box takes place after the partial frequency band is acquired by counting the pulses of the frequency of a selected one of the variable oscillators subjected to scanning with the successive harmonics of a reference frequency $p$, which forms the quantification step or frequency step between adjacent frequencies of the available spectrum. When in the course of a frequency scanning, the number of harmonics counted in a counter reaches a previously indicated value representing the desired frequency value, the apparatus is automatically switched to a phase-locked control condition wherein the frequency of the said oscillator is compared to a highly stable frequency, a harmonic of the said reference frequency $p$, by means of a phase discriminator, the oscillator then being controlled to supply with stability the desired frequency as determined by the value indicated on the control box under control of the output of the discriminator.

Each partial frequency band has a base frequency ($F_b$) and a termination frequency ($F_e$) all these frequencies being harmonics of $p$. The base frequency is the first frequency of a partial band met in the course of frequency scanning: for scanning by increasing frequency, it is the lower limit of the partial band. In the following description, scanning by increasing frequency has been selected, but the invention also applies to the case of scanning by decreasing frequency.

The apparatus, which is entirely automatic in function, also comprises control means for the synthesized frequency, these means initiating a frequency scanning if the said synthesized frequency is incorrect.

In accordance with the invention a wide band frequency synthesizer with a quantification step $p$ comprises:

$m$ oscillators each of which has a quantified limit frequency, the intervals between the limit frequencies of the successive oscillators being constant and equal to $kp$ ($k$ being an integer), the said oscillators as $q$ whole covering a band of relative width $r$, A group of $n$ operators dividing and/or multiplying the frequency in the respective ratios 1, $r$, $r^2$, . . . $r^n$ cooperating with the said oscillators to form $mn$ partial-bands, each of which has a limit frequency characterising a specific oscillator and a specific operator, A first generator of harmonics of step $kp$, A second generator of harmonics of step $p$, Means for frequency scanning the said oscillators, Means for locking the frequency of a selected one of the oscillators to a frequency which is a multiple of the said step $p$, to synchronize the frequency, Memory means where the limit frequencies are recorded, Register means for identifying and selecting a determined oscillator in accordance with one of the said limit frequencies, A counter provided with pre-indicating by means of a control box, Means for generating clock pulses, Logical means for counting the said clock pulses by the said counter up to coincidence with the value indicated by the counter and the value pre-indicated on the said control box, Means for inscribing the memory means with the last limit met before the said coincidence, modulation and filtering means for forming the beat frequency of a variable frequency issuing from one of the said oscillators with the output spectrum of one of the said generators of harmonics, and Logical means for applying the spectrum of the said first generator of harmonics of step $kp$ to the said modulation and filtering means at the beginning of scanning of frequency and to apply the spectrum to the second generator of harmonics of step $p$ after the passing of a limit frequency by the said variable frequency in the course of one frequency scanning operation.

In a first embodiment, the limit frequencies of all the partial bands, in number $mn$, are inscribed in the above-mentioned memory means, and in the course of a single counting of clock pulses up to coincidence with the pre-indicated number, one oscillator and one operator are selected to generate the frequency desired.

In a second embodiment, the clock pulses are counted once, and if the number counted is less than the base frequency of the lowest of the $m$ oscillators above mentioned, this number is multiplied by $r$, as many times successively as is necessary for the number obtained to exceed the said base frequency, the selection of one oscillator and of one operator to supply the desired frequency being assured by logical means in accordance with the last limit passed and the value of the final multiplication factor.

The invention will now be described in greater detail with reference to the accompanying drawings, in which.

Figure 1:
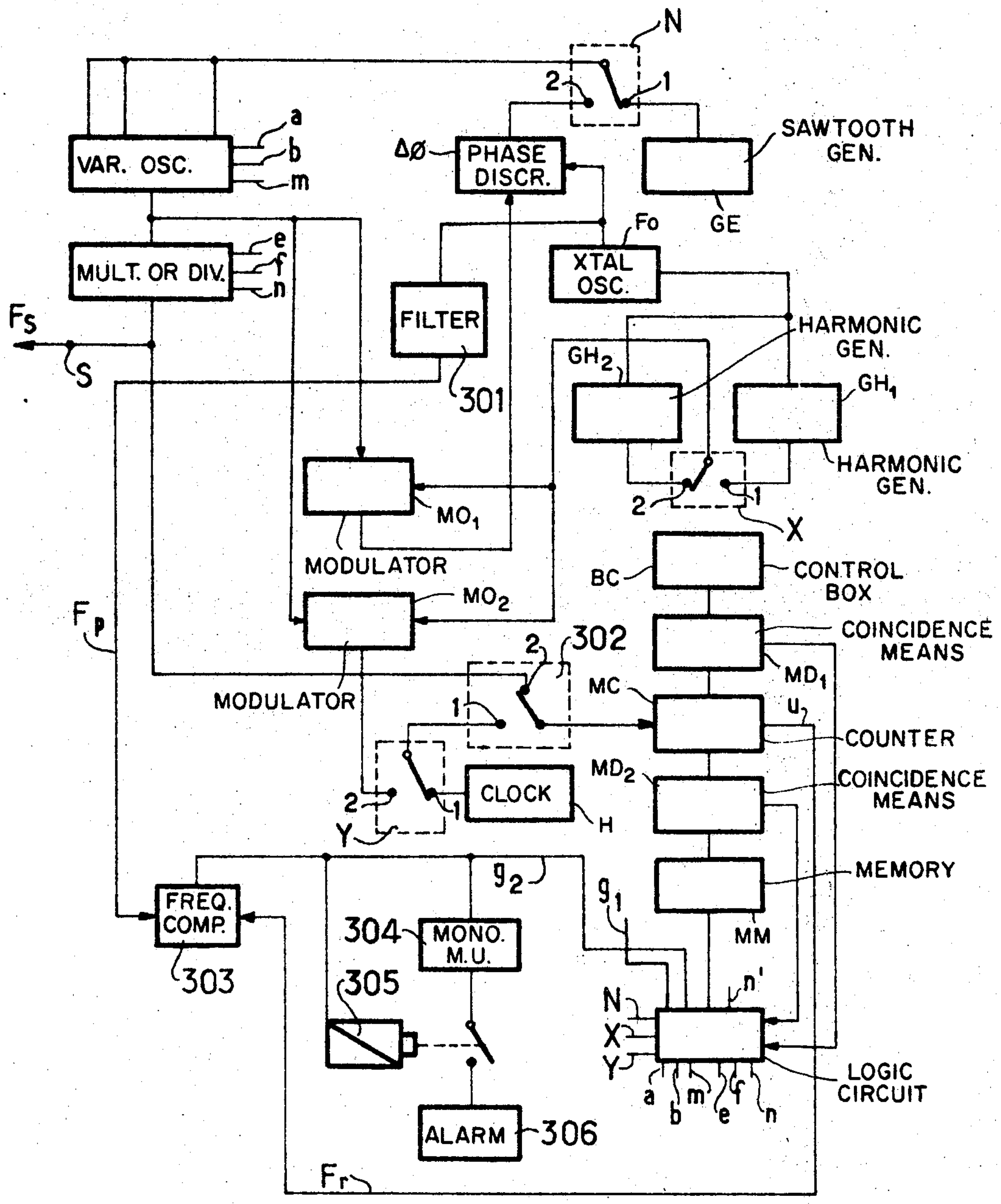
FIG. 1 is a general functional diagram of a synthesizer in accordance with the invention in its general form.

In the following description of an example of the present invention the oscillators are designated with the references A, B and so on and the operators with the references I, II and so on, the operator I supplying the basic range (divider 1). Certain numerical values of frequency will also be specified in addition to a specific number of oscillators and operators to facilitate comprehension of the invention, but these values are given solely by way of example and the invention is by no means bound to these imposed numerical values but, as will be apparent, has a quite general scope.

It has been found convenient to provide a system having a frequency spectrum which covers one basic range of the total size of one octave ($r=2$) and additional derived ranges obtained solely by division into the successive ratios $2^i$, where $i$ is equal to 1, 2, 4 and so on. The basic range then constitutes the highest octave of the spectrum and the derived ranges constitute octaves therebelow.

It is assumed that the spectrum passes from 2.5 mHz. to approximately 80 mHz., nominal value, with a quantification step of 0.1 mHz., the actual upper limit being 79.9 mHz. thereby providing 775 available frequencies. The number of variable oscillators provided may be 4: A, B, C, D each comprising 100 frequencies spaced by 0.1 mHz., respectively providing from 40.0 to 49.9 mHz., from 50.0 to 59.9 mHz., from 60.0 to 69.9 mHz., and from 70.0 to 79.9 mHz. providing 400 frequencies in the highest octave. There are five operators: I, II, III, IV, V with respective ratios 1, 2, 4, 8, 16.

The distribution of the partial bands, with their base frequency ($F_b$) and their end frequency ($F_e$) is given in Table 1 below, with designation of the appropriate variable oscillator and corresponding operator. The table also comprises a column R an explanation for which will be given later.

TABLE 1

| $F_b$ | | $F_e$ | R | Oscillator | Divider |
|---|---|---|---|---|---|
| 70.0 | to | 79.9 | 0 | D | I |
| 60.0 | to | 69.9 | 0 | C | I |
| 50.0 | to | 59.9 | 0 | B | I |
| 40.0 | to | 49.9 | 0 | A | I |
| 35.0 | to | 39.9 | 0 | D | II |
| 30.0 | to | 34.9 | 0 | C | II |
| 25.0 | to | 29.9 | 0 | B | II |
| 20.0 | to | 24.9 | 0 | A | II |
| 17.5 | to | 19.9 | 0 | D | III |
| 15.0 | to | 17.4 | 0 | C | III |
| 12.5 | to | 14.9 | 0 | B | III |
| 10.0 | to | 12.4 | 0 | A | III |
| 8.7 | to | 9.9 | 4 | D | IV |
| 7.5 | to | 8.6 | 0 | C | IV |
| 6.2 | to | 7.4 | 4 | B | IV |
| 5.0 | to | 6.1 | 0 | A | IV |
| 4.3 | to | 4.9 | 12 | D | V |
| 3.7 | to | 4.2 | 8 | C | V |
| 3.1 | to | 3.6 | 4 | B | V |
| 2.5 | to | 3.0 | 0 | A | V |

As the quantification step is 0.1 mHz., the limit frequencies mentioned above can be designated or identified by a numerical count of numbers 10 times greater than the megahertz value, i.e., by 700, 600, 500 and 400 in the highest octave down to 43, 37, 31 and 25 in the lowest octave. In other words as indicated above, since the frequencies are available in equally spaced steps across the entire spectrum, they may, for example, be designated or identified by a numerical value relating to the position of the frequency in the spectrum. In the example provided by Table 1 the frequencies are designated 25 to 799. However, while the division of these numbers by 2 and by 4 gives quotients which are integral without remainder, division by 8 and by 16 gives a remainder in certain cases:

$$700=8\cdot 87+4 \qquad 700=16\cdot 43+12$$
$$600=8\cdot 75+0 \qquad 600=16\cdot 37+8$$
$$500=8\cdot 62+4 \qquad 500=16\cdot 31+4$$
$$400=8\cdot 50+0 \qquad 400=16\cdot 25+0$$

These remainders which must be taken into account, have been inscribed in Table 1 in column R. Looking at the problem in another way to find one of the round numbers of hundreds from the multiplication of an integral number by 8 or by 16, it is necessary to add the remainder inscribed in the Table 1, if there is one.

A simplified description of one embodiment of the present invention will now be provided in connection with FIG. 1. In order to simplify the explanation the variable functional connections between members have been represented in the form of relays and mechanical or electromechanical contactors. It should be understood that in the preferred form, all the variable functional connections are realized electronically (AND circuits, NAND circuits and so on). For a skilled technician it will not require invention to set up the logical circuits accomplishing the desired functions, said circuits being known per se and not being of an inventive nature.

In FIG. 1 a group of $m$ variable oscillators OS (A, B, . . . M) is provided with controls $a$, $b$, . . . $m$ used for the selection of one of the oscillators by a logic circuit LO. One of these oscillators can be selectively connected by a contactor N to a saw-tooth generator GE providing a scanning voltage (position 1) or to the output of a phase discriminator $\Delta\phi$ (position 2).

The frequency of one of the oscillators OS is applied to the input of a group of operators OP providing either a multiplication of the oscillator frequency by a ratio $r^i$, or a division of the oscillator frequency by a ratio $r^j$, under the influence of a control $e, f \ldots n$ derived from the said logic circuit LO.

The output current of one of the oscillators OS is applied to the input of two modulators $MO_1$ and $MO_2$. A high stability reference oscillator (quartz) $F_0$ supplies a reference frequency to one input of the said phase discriminator $\Delta\phi$ and also supplies the reference frequency to two harmonic generators, one of which, $GH_1$, provides harmonic signals in wide steps ($kp$) corresponding to the limits of the partial frequency bands, and the other $GH_2$ provides harmonic signals in narrow steps ($p$) corresponding to the consecutive frequency steps of the spectrum. The output of harmonic generator $GH_1$ or $GH_2$ is selected by a contactor X, which at the position 1 connects the output of generator $GH_1$ to the input of the modulators $MO_1$ and $MO_2$ and in the position 2 connects the output of generator $GH_2$ to the modulators. The output of the modulator $MO_1$ is connected to an input of the phase discriminator $\Delta P$.

The circuit includes counting means MC which can receive pulses supplied by a clock H via terminal 1 of a switch Y, and terminal 1 of a switch 302. The counting means MC also receives output signals from the modulator $MO_2$ via terminal 2 of the said switch Y and terminal 1 of the switch 302. With the switch 302 contacting terminal 2 the counting means MC receives the output frequency $F_s$ (phase-locked control condition).

The counting means MC is connected to a first coincidence means $MD_1$, which is connected in turn to indicating means formed by a control box BC. The coincidence means is connected functionally with the said logical circuit LO.

Memory means MM can carry the inscription of limit frequencies for each partial band of frequencies and is in functional connection with the counting means MC by means of a second coincidence means $MD_2$, connected functionally to the logical circuit LO.

The operation of the portion of the system thus far described is as follows: The use here indicated on the control box BC is a desired frequency $F_t$. With the coincidence broken at the means $MD_1$ the contactors N, X, Y are switched automatically to terminal 1 under the control of the logical circuit LO. The clock H is thereby connected to the input of the counting means MC, and the clock pulses advance the counter. The scanning of the frequency of one of the oscillators OS begins, but for the duration of the first stage of counting, which does not exceed 1 to 2 milliseconds, these effects are negligible.

The counter MC, advancing in count, passes successively over the numerical values of the available frequencies in order, including the numerical values of the limits which are held in the memory MM. At the coincidence of the counter with the numerical value indicated by control box BC (first coincidence confirmed by the member $MD_1$), the value of the last limit cleared in the memory MM, confirmed by the member $MD_2$, brings about by means of the logical circuit LO the choice of one oscillator OS and of one operator OP, which are then enabled. The logical circuit LO, under the influence of the first coincidence, brings about the switching of the switch Y to terminal 2, as well as the inscription of the numerical value of the last limit cleared by memory MM into the counter MC in place of the numerical value of the desired frequency which has prompted the first coincidence.

The effective frequency scanning then begins. With switch Y connected to terminal 2 the output of modulator $MO_2$ will be connected to the counting means MC, a portion of which similar to the operators OP will provide an output when the number of pulses received from the modulator $MO_2$ corresponds to the partial frequency band including the desired frequency. The modulator $MO_2$ receives the harmonics of the limits of the basic partial frequency band so that as each limit is reached by the selected oscillator being scanned the correspondence will be detected by the modulator which generates an output pulse in response thereto. These pulses, representing successive partial bands through which the oscillator passes, are counted by the portion of the counting means MC. When the variable frequency clears the lower limit of the range previously selected during the first coincidence, the logical circuit LO causes the contactor X to pass to position 2.

The pulses at step $p$ are now counted in counting means MC since the generator $GH_2$ is now connected to modulator $MO_2$. The counter in counting means MC is advanced by the pulses now received from modulator $MO_2$ from the numerical value of the last limit reached by memory MM stored therein until it reaches a second coincidence confirmed by the member $MD_1$ with the numerical value set in control box BC, which causes the contactor N to switch to terminal 2 at the pulse which precedes the corresponding pulse at the desired frequency.

A control frequency voltage supplied by the phase discriminator $\Delta\phi$ then governs the frequency of the variable oscillator selected, in the place of the scanning voltage supplied by the generator GE. One obtains a control of frequency, with emission at a terminal S connected to the output of the group of operators OP of the desired synthesized frequency $F_s$.

The counter MC can function as a divider with variable range in functional connection with its coincidence register $MD_1$. If the control box BC indicates a numerical value K, which is inscribed in the register $MD_1$, a frequency F applied at the input of the counter MC supplies to the output $u$ of the said counter a frequency $F_r = F/K$. The functioning of the divider with variable range is well known in the electronic art and there is no need for it to be explained in detail here.

A filter 301 is provided for extracting from the spectrum of the high stability reference oscillation $F_0$ a frequency $F_p$ equal to the quantification step of the frequency synthesizer (for instance $F_p = 100$ kHz.). The contactor 302 can be controlled by the logical circuit LO by means of an output $g_1$.

A frequency comparing member 303 of numerical type receives at one input the frequency $F_p$ issuing from the filter 301, and at another input the frequency $F_r$ which has come from the counter MC functioning as a variable range divider. The comparing member 303 can advantageously be of the type described in the patent application of Lucien Babany, entitled "Circuit Serving for Detecting the Synchronisation Between Two Frequencies" filed on Jan. 2, 1968, and having Ser. No. 695,038.

Such a member can for instance supply at the output a "0" of the frequencies are coincident and a "1" in the opposite case.

The output of the comparing member 303 is connected to one input of the logical circuit LO by a line $g_2$, as well as to a monostable flip-flop 304 and to the control of a switch 305, which can apply the output of the monostable flip-flop 304 to an alarm device 306.

The functioning of this portion of the control device is as follows: When the process of frequency scanning has been terminated and the process of synchronization by means of the phase discriminator $\Delta\phi$ has been initiated, the logical circuit LO controls by its output $g_1$ the switching of the switch 302 from terminal 1 to terminal 2.

If the frequency $F_r$ which issues from the counter MC is equal to the frequency of step $F_p$, the member 303 applies an "0" logical circuit to the logical circuit LO, which remains inactive. In the opposite case, the member 303 applies a logical "1" to the logical circuit LO, which then re-initiates frequency scanning by switching the contact of switch N to terminal 1 by control $n'$.

The same time the logical "1" is applied to the monostable circuit 304 and to the switch 305, which closes and connects the input of the warning device 306 to the output of the monostable circuit 304. The delay at the output of the monostable circuit 304 is equal to a predetermined number of periods of frequency scanning, for instance approximately 5 times the duration of one frequency scanning. If after the checking of a first frequency scanning, the frequency regulates itself at the value indicated by the end of at the maximum 5 scannings, no alarm is released, since when a signal appears at the output of the monostable circuit 304 the connection with the alarm device 306 is broken by the switch 305 which has opened again as soon as the frequency required has been obtained at the output S.

On the other hand, if at the end of approximately 5 frequency scannings, for example, the frequency has not been regulated correctly, it is an indication of permanent defect in the installation which is incapable of supplying the desired frequency; the operator is then alerted by a warning.

Figure 2:
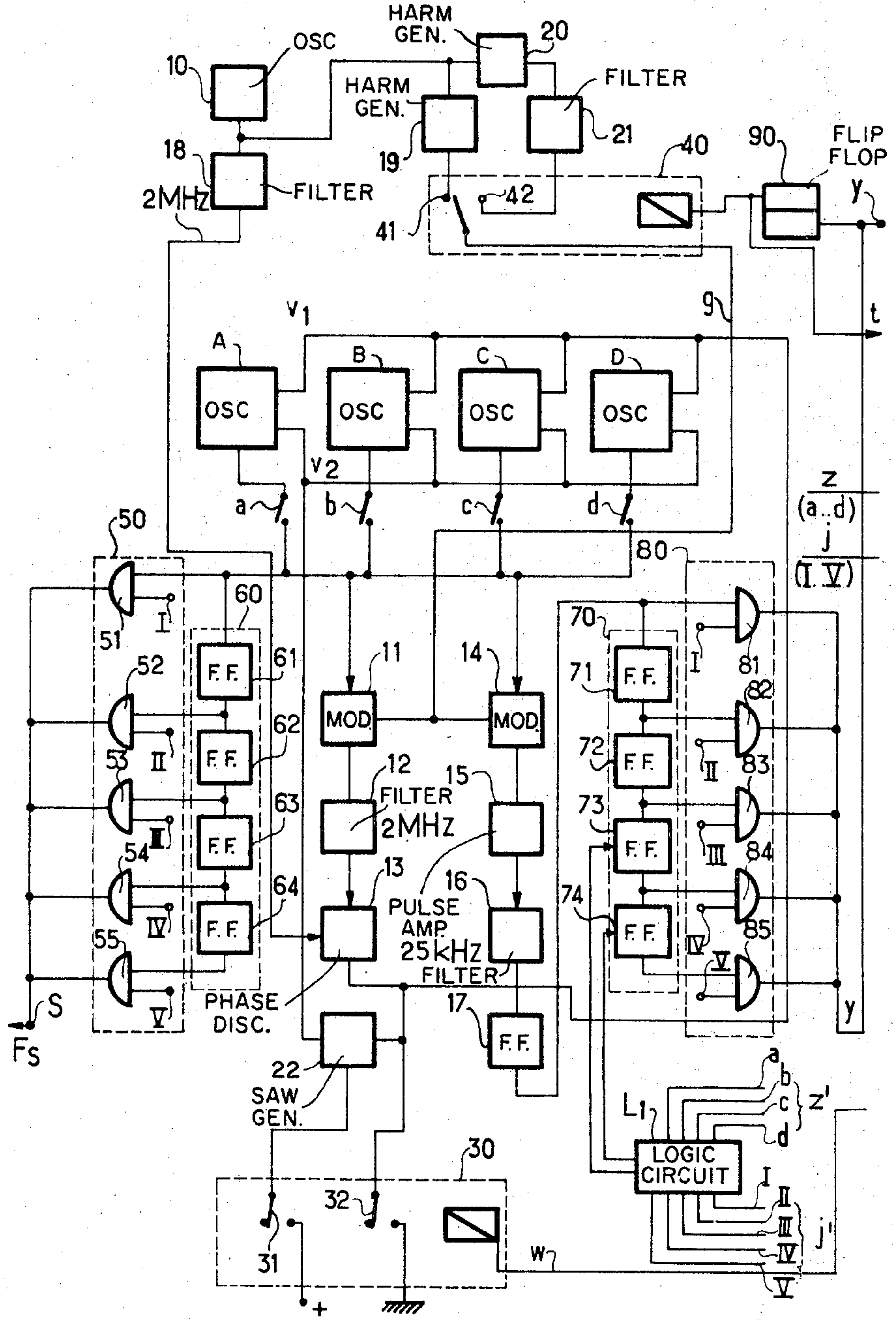
FIGS. 2, 3, 4 illustrate a synoptic diagram of the first embodiment of a frequency synthesizer in accordance with the invention.
Figure 3:
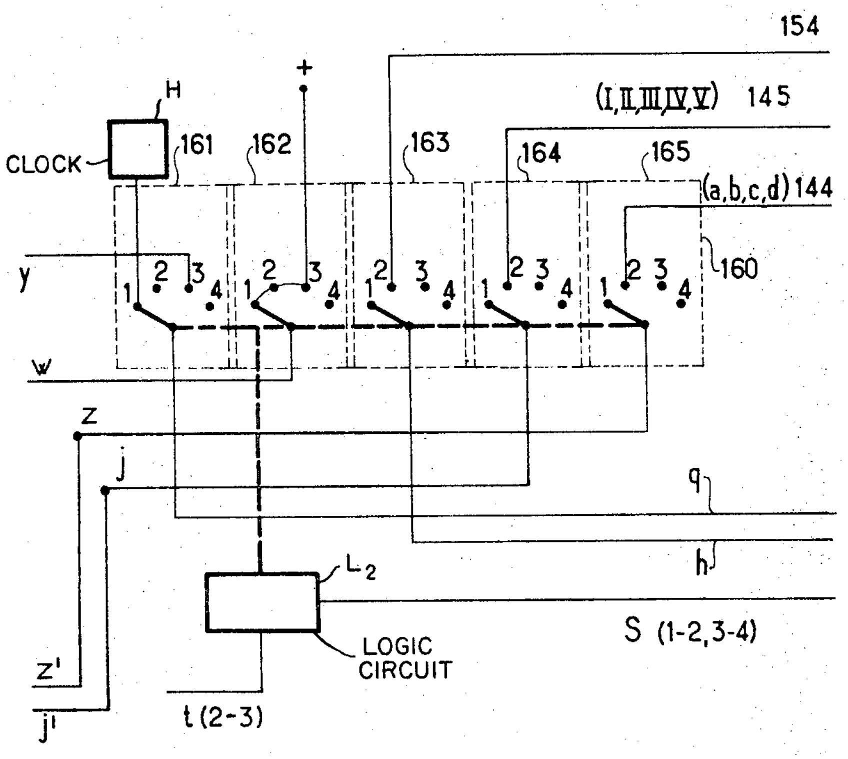
Figure 4:
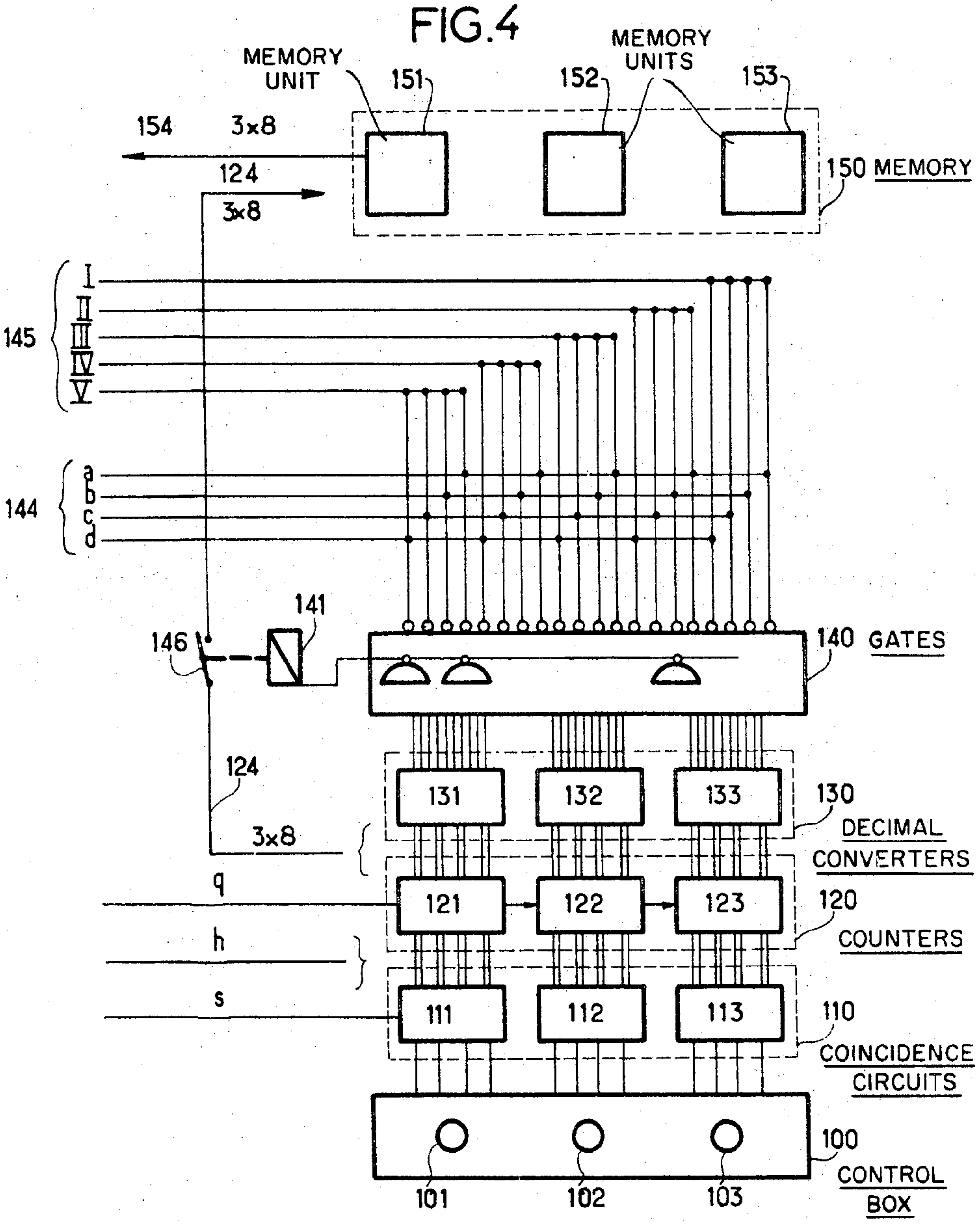

It is assumed that the synthesizer gave a definition of 0.1 mHz. In FIGS. 2, 3 and 4, which more specifically illustrate the system of FIG. 1, it can be seen that the system comprises four oscillators A, B, C, D, the four of them covering a nominal range of one octave, 40–80 mHz. (in fact 40 to 79.9 mHz.), along with the additional sub-ranges given at the top of the Table 1 above.

One of these oscillators can be put in operation under the influence of a control which is symbolized in FIG. 1 in the form of a switch *a, b, c, d* engaging respectively one of the oscillators. The outputs of the four oscillators are applied in parallel to the input of a succession of dividers by 2 in cascade, contained in a frame 60 comprising binary flip-flops 61, 62, 63, 64 connected in series. At all the terminals of the divider 60 (input terminals, output and intermediate terminals) there are connected respectively the inputs of NAND gates 51, 52, 53, 54, 55. These circuits are contained in a frame given the reference number 50. Each of these circuits has a control terminal referenced I, II, III, IV, V respectively. One gate accordingly defines each of the operators I, II, III, IV, V which bring about the division by 1, 2, 4, 8, 16 respectively. The outputs of the five gates of the frame 50 are connected to a common output terminal S. The engagement of the switch contacts *a, b, c, d* are controlled by a line *z*, and the terminal I, II, III, IV, V by a line *j*.

A high stability oscillator 10 provides the stable reference frequency, for instance a frequency of $F_0=1$ mHz. It is assumed that it also supplies a first harmonic i.e. 2 mHz., which is filtered by a filter 18. The stable frequency energizes a first harmonic generator 19 which supplies the harmonic 10 mHz. and a second harmonic generator 20 which supplies, through a high pass filter 21, the harmonics of 0.1 mHz. greater than 40 mHz.

Two modulators 11 and 14 each have one input connected to the common output of the oscillators A, B, C, D and another input connected to a line *g* providing the output of one of the generators 19 or 20. By the operation of a relay inverter 40, the line *g* can have the other end connected to the output of the harmonic generator 19 providing wide step harmonics via contact 41, or to the output of the harmonic generator 20 providing fine step harmonics by way of contact 42.

The modulator 11 is connected to a band pass filter 12 having a narrow band centered at 2 mHz., which has one output connected to a phase discriminator 13 and another input connected to the output of the filter 18.

The oscillators A, B, C, D, are each provided with a variable capacity diode (not illustrated), whose terminals are connected on the one hand to a common line $v_1$, and on the other hand to a common line $v_2$. The line $v_1$ is connected to the output of the above mentioned phase discriminator 13, as well as to one terminal of a scanning voltage generator 22, preferably providing a saw-tooth voltage. The said saw-tooth voltage generator 22 has another terminal connected to the said line $v_2$. The line $v_1$ can be connected to ground by an operative position contact 32 of a relay 30. The generator 22 can be supplied by another operative position contact 31 of the said relay 30. The relay 30 is controlled by way of line *w*.

The modulator 14 is connected to a pulse amplifier 15, followed by a band pass filter 16 having a relatively narrow band, for instance (25±1) kHz., the output of which is connected to a binary flip-flop 17. The output of the flip-flop 17 is connected to an assembly of four circuits 70 performing a dividing by 2 comprising binary flip-flops 71, 72, 73, 74 and five NAND gates, 80, comprising the gates 81, 82, 83, 84, 85 the whole being interconnected as is the assembly (50, 60) described above. The gates have control terminals which carry the same references as the gates of the frame 50 (I, II, III, IV, V); the gates of the same reference are connected together and receive the same control signals. The outputs of the five gates of the frame 80 are connected together by a conductor *y*.

A logical circuit $L_1$ receives at four inputs the signals *a, b, c, d* (connection $z'$), mentioned above, and at five other inputs the signals I, II, III, IV V (connection $j'$). This logical circuit, connected to the two flip-flops 73 and 74, is constituted, in accordance with known logical circuit techniques in such a way as to condition the said flip-flops to indicate in the binary counter that they form a remainder, as designated in the column R of Table 1, as a function of one oscillator and of one divider corresponding to the limit frequency of one of the sub-ranges.

In the course of one frequency scanning, there are two beats of the variable frequency $F_V$ with each of the harmonic signals $F_2$, for $F_2-F_V=10$ kHz. and $F_V-F_2=10$ kHz. The flip-flop 17 operates a division by 2, giving a single beat per coincidence.

In FIG. 4, a control box 100, having three decades controlled by three push buttons 101, 102, 103, makes it possible to indicate a value between 0 and 999 on a coincidence circuit 110 with three decades 111, 112, 113, which is likewise connected to a counter 120 with three decades 121, 122, 123. The decades of the counter are preferably of the 2–4–8 type. The coincidene decade 111 is connected to the conter decade 121 by eight conductors corresponding to the direct and complementary terminals of each of four flip-flops therein. One finds again a similar connection by eight wires between 112 and 122, and between 113 and 123. Between the decades of the control box 100 and the coincidence decades, the connections are of four wires.

A decimal converter 130 provides a conversion of the states of the counter 120. It comprises three decades 131, 132, 133, connected respectively by eight wires to the decades 121, 122, 123 of the counter, each having 10 outputs of value 0 to 9.

An assembly 140 of twenty NAND gates is provided at the output of converter 130, the gates having three input terminals, each of which is connected to one of the ten output wires of one of the decades of the decimal converters 132, 132, 133. At each of the said gates, connections are made by wiring with one of the outputs of 131, 132, 133 corresponding to one of the 20 limit frequencies.

The member 140 has three groups of outputs:

(1) A single output 141, to which are connected in common all the outputs of the twenty gates.

(2) A group of outputs 144, indicated *a, b, c, d,* each of which collects the outputs of all the gates cooperating with the oscillator A, B, C, D respectively, in accordance with Table 1.

(3) A group of outputs 145, indicated I, II, III, IV, V each of which combines the outputs of all of the gates cooperating with the operator I, II, III, IV, and V, respectively, in accordance with Table 1.

The member 150 is a reproduction register with three decades 151, 152, 153, each of which can receive by eight lines the states of the decades 121, 122, 123 respectively of the counter 120. The reproduction connection is accordingly ensured by three times eight wires, symbolised by the line 124. The states held in memory in the register 150 can be reinscribed in the counter 120 by a connection 154 which also effectively comprises three times eight wires.

FIG. 3 shows a contactor 160 made up of five selection switches 161, 162, 163, 164 and 165, with four terminal positions indicated 1, 2, 3, 4.

The switch 161 has its sliding contact connected to the input *q* of the counter 120. The contact 1 is connected to a clock oscillator H the contact 3 receives the signals on line *y* mentioned in the description of FIG. 1.

The switch 162 has its sliding contact connected to the conductor *w* which controls operation of switch 30 of FIG. 1. The contacts 1, 2, 3 are connected together to a source of supply symbolised by +.

The switch 163 represents symbolically a connection between the three decades of the register 150 and the three decades of the counter 120. Its sliding contact is connected to the conditioning terminals *h* of the flip-flops. The contact 2 is connected to the outputs of the flip-flops of the register 150. It should be clear from this schematic diagram that at the switch position 2 the states held in memory in the register 150 can be transferred to the decades of the counter 120.

The switch 164 represents symbolically a multiple connection member between the outputs of the group 145, at the contact 2, and a connection *j* at which accordingly the signals I, II, III, IV, V can circulate.

The switch 165 represents symbolically a multiple connection member between the outputs of the group 144, at the contact 2, and a connection *z* at which accordingly the signals *a, b, c, d*, can accordingly circulate.

The multiple connection *j* is connected to all the terminals marked I, II, III, IV, V in the frame 50, in the frame 80, and on the logical circuit $L_1$ (FIG. 2). The multiple connection *z* is connected to all the terminals marked *a, b, c, d* in the oscillators A to D and in the logical circuit $L_1$ (FIG. 2). The conductor *y*, connected to the contact 3 of the switch 161, is likewise connected to the input of a bistable flip-flop 90 one output of which is connected to the relay 40 of FIG. 2.

A multiple connection 124 is connected between the outputs of the flip-flops of the counter 120 and of the conditioning terminals of the flip-flops of the register 150. This connection can be formed by a switch 146 which can be controlled by a signal appearing on the conductor 141 (FIG. 4).

A logical circuit $L_2$ controls the actuation of the switch 160 from the position 1 to the position 2, and the switching from the position 3 to the position 4, as well as the switching from the position 4 to the position 1, under the influence of an order received at a wire *s* issuing from the coincidence member 110 (FIG. 4). The said logical circuit $L_2$ controls the switching from the position 2 to the position 3 of the contactor 160 under the influence of a signal supplied by a conductor *t* connected to the output of the flip-flop 90 (FIG. 2).

The device is provided with a general return to zero means, which has not been illustrated in FIGS. 2, 3 and 4 so as not to encumber the diagrams. This return to zero does not affect the counter 120, whose start position is unimportant at the beginning of the operation, as will be seen.

The operation of the system is as follows: The user indicates a frequency desired at the control box. In all cases, there is no coincidence at member 110. It results that the switch 160 is brought into position 1 by the logical circuit $L_2$. Thus, the clock H is connected to line *q* via switch 161 and the line W is energized via switch 162 thereby actuating relay 30.

With the member 22 supplied with current, the saw-tooth voltage begins. Simultaneously, the clock pulses are received by the counter 120 which advances in count. Each time the counter indicates a value equal to a limit frequency as determined in the gate combination 140, the state of the counter is transferred to the register 150 by reason of the temporary closing of the contact 146.

When the state of the counter coincides with the value indicated on the control box (first coincidence), a signal passed to the logical circuit $L_2$ by the wire *s* causes the switch 160 to advance to the position 2. The counting of the clock pulses stops due to disconnection of the clock from the counter. Only the said coincidence has a logical value. The counter can have any start position since it is not the number of pulses received from the clock that is measured, but the value of the count as compared with the numerical value in box 100 which produces coincidence. The last limit frequency indicated in the register 150 is transferred to the counter via line 154 and switch 163. At the same time an oscillator and an operator corresponding to the said limit frequency are selected via lines 144 and 145 through switches 164 and 165, respectively. The corresponding remainder is also inscribed on the bistables 73 and 74 from logic circuit $L_1$ as a result of the signals on lines 2′ and *j*.

The clock frequency can for instance be approximately 500 kHz., the entirety of the preceding operating does not last longer than two milliseconds. The frequency scanning, made under the influence of the saw-tooth voltage supplied by the generator 22 has accordingly scarcely started at the time an oscillator and an operator are selected (it lasts in fact one second at the maximum).

The useful scanning then commences putting into operation the oscillator and the operator desired to cover the partial band where the desired frequency F is located. For example, if the desired frequency $F=13.6$ mHz., the selected members are the oscillator B and the operator III (division by 4). The counter 120 should bear the indication 125. In fact, it bears the indication 126, all the limit frequencies indicated in the member 140 being systematically increased by one unit, for a reason which will be given below.

At the moment, it is the harmonic spectrum with wide steps (40, 50, 60, 70 mHz.) which is applied to the modulators 11 and 14 from the generator 19. As the frequency of the oscillator B passes through each partial frequency band an output will be provided from modulator 14 via flip-flop 17.

When the frequency $F_v$ of the variable oscillator B, divided by 4 by the flip-flops 71 and 72, passes the limit 12.5 mHz., a pulse derived from gate 83 appears at the wire *y*. As a result, the relay 40 is actuated and now the fine spectrum, with step *p* ($p=100$ kHz.) is applied to the modulators 11 and 14 from generator 20. Simultaneously the wire *t* receives from the output of the flip-flop 90 a signal which, applied to the logical circuit $L_2$, causes the switch 160 to advance to the position 3. In these conditions, the beat of the variable frequency $F_v$ with the harmonics of the fine spectrum are counted from the position 126 presently stored in counter 120. When the counter indicates 135, corresponding to the desired frequency 13.5 mHz., the variable frequency oscillator generates the signal 13.4 mHz. since the counter was initially advanced one count. At this moment there is produced a second coincidence of the counter with the control box, which causes switch 100 to advance to position 4 under control of the logic circuit $L_2$ receiving a signal on line *s*.

As a result, the relay 30 is de-energized due to disconnection of line 2 from energizing voltage. The saw-tooth generator is no longer supplied with current, its voltage takes up a reference position of rest, with a certain delay (this process will be described in greater detail below). At the same time the output terminal of the phase discriminator 13 is unblocked, its voltage begins to act on the oscillator in operation (here oscillator B).

When on recovering its rest position the voltage at the end of the saw-tooth causes the following signal of the fine spectrum to be passed, at that moment the filter 12 transmits to the phase discriminator 13 a signal of frequency 2 mHz. (there have been others of these in the course of the scanning, but they were without effect, as the phase discriminator was then blocked). The synchronization then develops, the ray 13.5 mHz. being literally locked onto the reference by the device.

Thus, in the most usual case where *r* has the value 2, the value of the remainder will be inscribed in numeration on the second group 70 of binary dividers by the logical circuit $L_1$ in functional connection with the selection circuits of one oscillator and of one operator corresponding to a determined limit frequency.

All the limit frequencies are shifted systematically by one quantification step in such a way as to release a control signal when the scanning frequency passes over the frequency which precedes by one quantification step the desired frequency, the said control signal having the effect of freeing the frequency control member 13, which is blocked at the beginning of a scanning operation *a* the said frequency control member 13 then provides synchronization on the quantification step which follows i.e. on the desired frequency. To obtain with certainty synchronization at the frequency desired, the apparatus of the invention has means for slowing down the speed of scanning of frequency between the said two quantification steps, which makes it possible to have a total scanning duration which is relatively short while still ensuring great security of synchronization.

If one modifies the indication of the control box, the coincidence is destroyed, the logical circuit $L_2$ gives an order to return the switch 160 to the position 1 and the process begins anew.

If instead of indicating the frequency 13.5 mHz., one had indicated for instance 4.7 mHz., the process would have been the same on the whole. The oscillator D and the divider V would have been selected. The remainder 12 given in Table 1 would have been indicated on the flip-flops 72 and 74, the flip-flop 72 having the numerical value 4 and the flip-flop 74 the numerical value 8.

A very frequent case in the application of frequency synthesizers is the case of modulation of a carrier frequency with a single side band, and in such cases, the desired carrier frequency is not the frequency supplied by the synthesizer: for a determined equipment, it is spaced by a fixed amount F ("intermediate" frequency). To facilitate the use of the synthesizer, it is convenient for the apparatus to bear directly the indication of the carrier frequency desired.

To take into account the difference, in the above mentioned memory means, one inscribes the corrected limit frequencies at the desired spacing, which makes it possible to indicate on the control box the desired carrier frequency and to obtain effectively the synchronization at the frequency to be supplied.

For instance if the carrier frequency $F_t$ exceeds the frequency of the synthesizer $F_s$ by an intermediate frequency of $\Delta$ steps ($\Delta F = \Delta \cdot p$), one will decrease the limit frequencies of Table 1 by $\Delta - 1$ steps by including the shifting of one step mentioned above.

The same correction is found applied to all frequencies $F'_B = F_B - (\Delta - 1)$—supplied by the synthesizer $F_s$. The frequency $F_s$ supplied by the synthesizer being less than $\Delta p$ at the indicated frequency $F_A$, since the carrier frequency $F_t$ is transposed by $\Delta \cdot p$ in other circuits of the apparatus of which the synthesizer forms part, one reverts to a carrier frequency $F_t$ equal to the indicated frequency $F_A$.

For instance, if $\Delta \cdot p$ is taken to be equal to 900 kHz., one will decrease the frequencies $F_B$ of Table 1 by 800 kHz. One thus obtains Table 2 on the following page. Clearly, in such conditions the counter starts from the position "0" and not from the position "1" as previously. If the correction were applied in the other direction, one would add 1 to the correction.

TABLE 2

$\Delta F = 900$ kHz.

| $RF_b$ | | $F_c$ | Wired limit | R | Oscillator | Operator |
|---|---|---|---|---|---|---|
| 69.2 | to | 79.1 | 692 | 0 | D | I |
| 59.2 | to | 69.1 | 592 | 0 | C | I |
| 49.2 | to | 59.1 | 492 | 0 | B | I |
| 39.2 | to | 49.1 | 392 | 0 | A | I |
| 39.2 | to | 39.1 | 342 | 0 | D | II |
| 29.2 | to | 34.1 | 292 | 0 | C | II |
| 24.2 | to | 29.1 | 242 | 0 | B | II |
| 19.2 | to | 24.1 | 192 | 0 | A | II |
| 16.7 | to | 19.1 | 167 | 0 | D | III |
| 14.2 | to | 16.6 | 142 | 0 | C | III |
| 11.7 | to | 14.1 | 117 | 0 | B | III |
| 9.2 | to | 11.8 | 092 | 0 | A | III |
| 7.9 | to | 9.1 | 079 | 9 | D | IV |
| 6.7 | to | 7.8 | 067 | 0 | C | IV |
| 5.4 | to | 6.6 | 059 | 4 | B | IV |
| 4.9 | to | 5.3 | 042 | 0 | A | IV |
| 3.5 | to | 4.1 | 035 | 12 | D | V |
| 2.9 | to | 3.4 | 029 | 8 | C | V |
| 2.3 | to | 2.8 | 023 | 4 | B | V |
| 1.7 | to | 2.2 | 017 | 0 | A | V |

If one desires a carrier frequency $F_t$ different from the frequency supplied by the synthesizer $F_s$, corresponding for instance to an intermediate heterodyne receiver frequency of 900 kHz. with four instance $F_t = F_s - 900$ kHz., one constitutes by preliminary wiring at the terminal, the numerical value $F_B - 8$ (in tenths of megahertz), by applying the correction of one unit mentioned above. One deduces therefrom the Table 2 of the limit frequencies $F'_B$ which it is necessary to constitute in the member 150. For the rest, the process is exactly the same as in Table 1. The operator indicates the carrier frequency which is desired at the control box directly, without correction.

Figure 5:
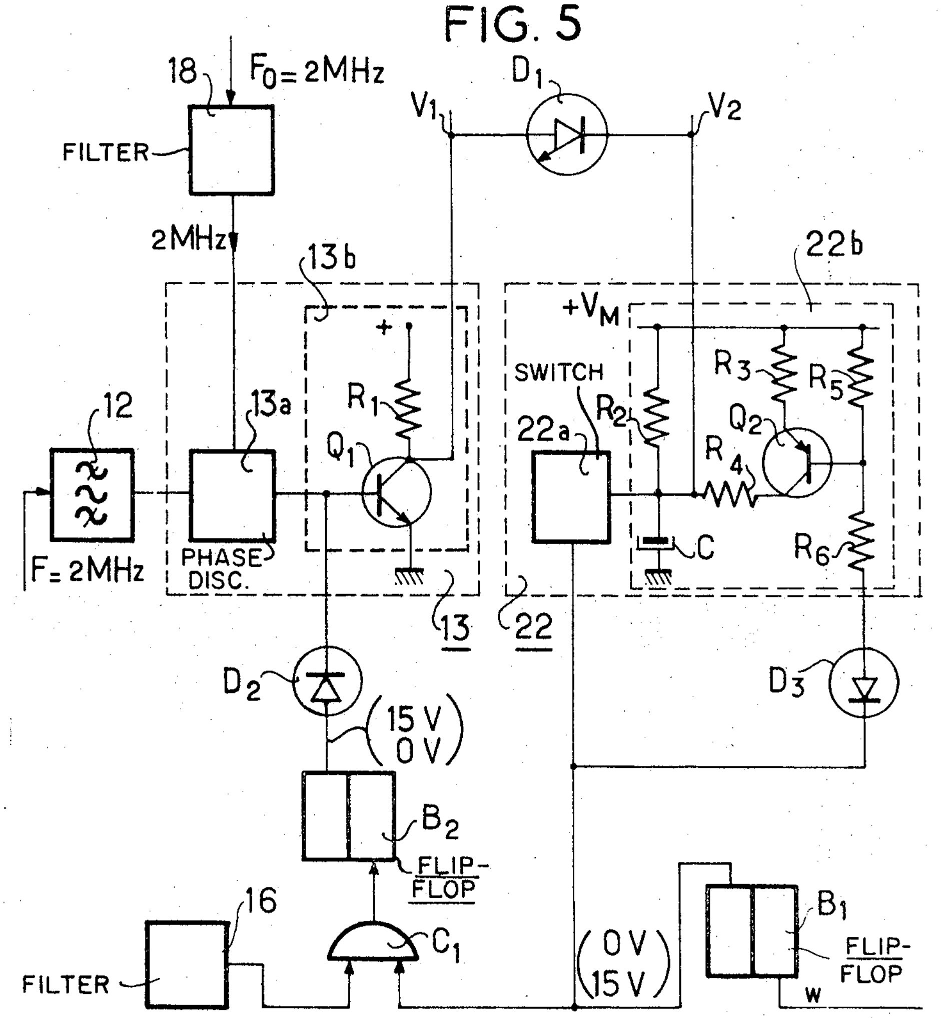
FIG. 5 is an electric wiring diagram of a member used for scanning frequency at two speeds.

In FIG. 5, which illustrates a detailed portion of FIG. 2, the phase discriminator unit 13 receives at one input a reference frequency, for instance 2 mHz., which has issued from the band pass filter 18, and a variable frequency which can be under the control of the reference frequency issuing from the filter 12. The unit 13 includes the phase discriminator itself **13*a*, and an output circuit 13*b*** constituted essentially of a transistor $Q_1$ whose collector, loaded by a resistor $R_1$, supplies a voltage $V_1$.

The saw-tooth voltage generator assembly 22 comprises a member **22*a* of the switch type and a time constant circuit 22*b*. The time constant circuit 22*b* includes a resistor $R_2$ and a capacitor C and also a PNP transistor $Q_2$, whose emitter is connected to the position supply terminal $V_m$ through a resistor $R_3$, whose collector is connected by a resistor $R_4$ to the common point between resistor $R_2$ and capacitor C, and whose base is polarized by means of two resistors $R_5$ and $R_6$. From the saw-tooth voltage generator 22** a voltage $V_2$ issues. The voltages $V_1$ and $V_2$ are applied to two terminals respectively, of a variable capacity diode $D_1$ which is incorporated in the circuit of a variable frequency oscillator (not fully illustrated in FIG. 5).

The saw tooth voltage generator 22 is of the opened, not the released type. Such generators are well known, in particular in the construction of time bases of oscilloscopes, which are either of the opened type or of the released type.

A diode $D_2$ is connected to the base of the transistor $Q_1$, another diode $D_3$ is connected to the base of the transistor $Q_2$ through the resistor $R_6$.

A logical circuit comprises a first bistable flip-flop $B_1$, which can receive an order through the line *w* in functional connection with the coincidence register of the counter of harmonic signals, a NAND circuit having an input connected to one output of the flip-flop $B_1$ and another input connected to the output of the filter 16, centered at 25 kHz.; it comprises also a second bistable flip-flop $B_2$, one input of which is connected to the output of the flip-flop $B_1$ via the gate $C_1$. The output of the flip-flop $B_1$ is also connected to the input of the member 22*a*. The flip-flop $B_1$ can if necessary be replaced by an inverter.

The operation of the described system is as follows: In the absence of coincidence, there is a high positive voltage at the diode $D_2$, and therefore at the base of the transistor $Q_1$. As a result, this transistor is saturated and its collector, i.e. the line $V_1$, is at a fixed voltage approximating 0. There are 0 volts at the cathode of the diode $D_3$ which polarizes the base of the transistor $Q_2$, this transistor is accordingly saturated, its internal impedance is practically in parallel to the resistor $R_2$. For instance, with $R_2=56K\Omega$, $R_3=22K\Omega$ and $R_4=100\Omega$, the equivalent resistance of the time constant cell is approximately 16KΩ.

When the register reaches coincidence, the flip-flop $B_1$ applies to the diode $D_3$ a voltage of +15 v.; the diode $D_3$ then becomes non-conductive; the transistor $Q_2$ is blocked and the resistance of the time constant cell is practically equal to 56KΩ. The drop in the saw-tooth voltage accordingly decreases considerably, by a factor of 3.75.

When, via the filter 16 the first pulse which follows the coincidence arrives, the flip-flop $B_2$ itself is energized and applies to the diode $D_2$ a voltage of 0 v. This diode becomes non-conductive, and the output voltage of the phase discriminator 13*a* is amplified by the transistor $Q_1$ and applied to the line $V_1$. This is the blocking signal.

At the same time the operative position of the flip-flop $B_1$ prevents a fresh opening of the generator 22, and the capacitor C remains charged. This is the synchronization stage, with comparison of the frequency emitted to a high stability frequency by the phase discriminator.

When for any reason there is a break in synchronization, a return to zero position (not illustrated) controlled by the general logic circuit of the equipment, returns the flip-flops $B_1$ and $B_2$ to the rest position.

In the example described the slowing down of the rise in the saw tooth voltage is produced at the frequency $F_s$—75 kHz. and the unblocking of the phase discriminator at the frequency $F$—25 kHz. The conditions for certain synchronization are accordingly brought together.

Figure 6:
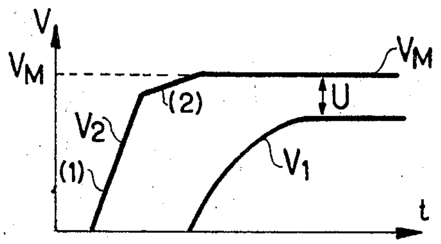
FIG. 6 illustrates three graphs intended to facilitate an understanding of the functioning of the invention.

In FIG. 6, a graph is given showing the exploration-synchronization passage process. The saw-tooth voltage $V_2$ is composed of a first segment (1) with steep slope, then, after an order transmitted by the line *w*, there is a segment (2) with gentle slope and simultaneously the voltage $V_1$ develops. When $V_2$ reaches its constant value $+V_M$, $V_1$ regulates itself to a lower value of U volts, i.e. the voltage value which, applied to the terminals of th e variable capacity diode $D_1$ supplies the desired frequency.

Figure 7:
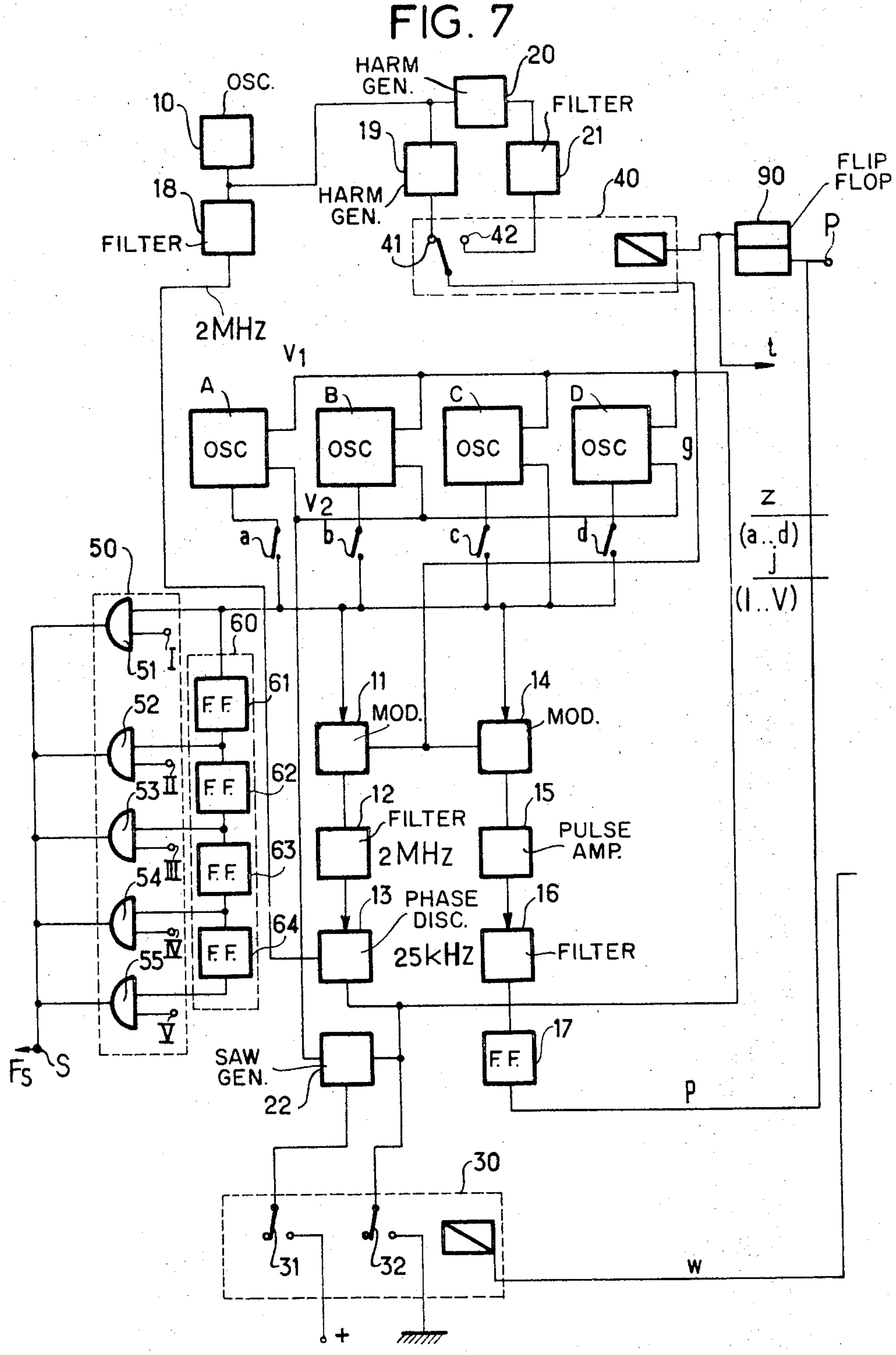
FIGS. 7, 8, 9 illustrate a synoptic diagram of a second embodiment of the invention.
Figure 8:
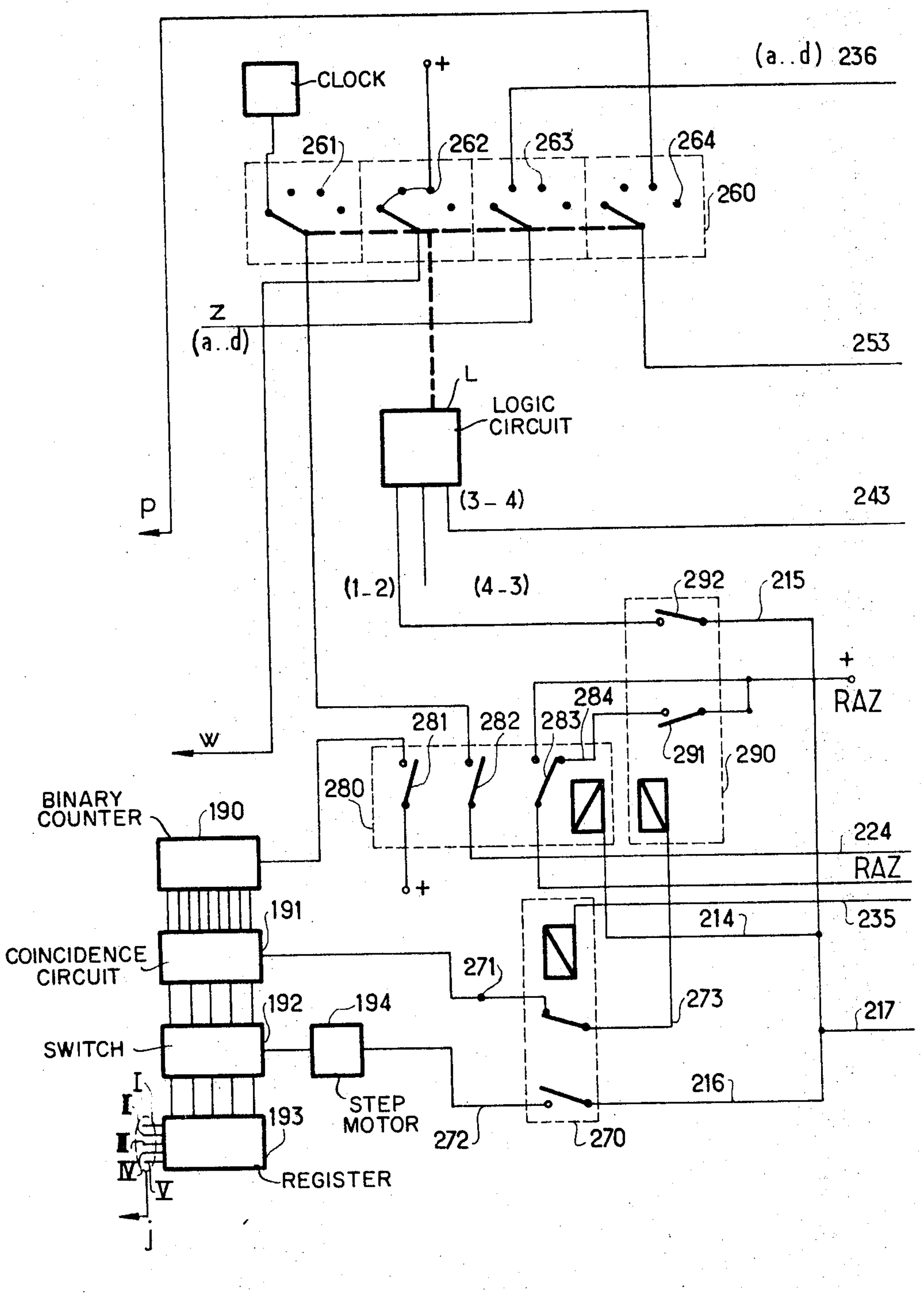
Figure 9:
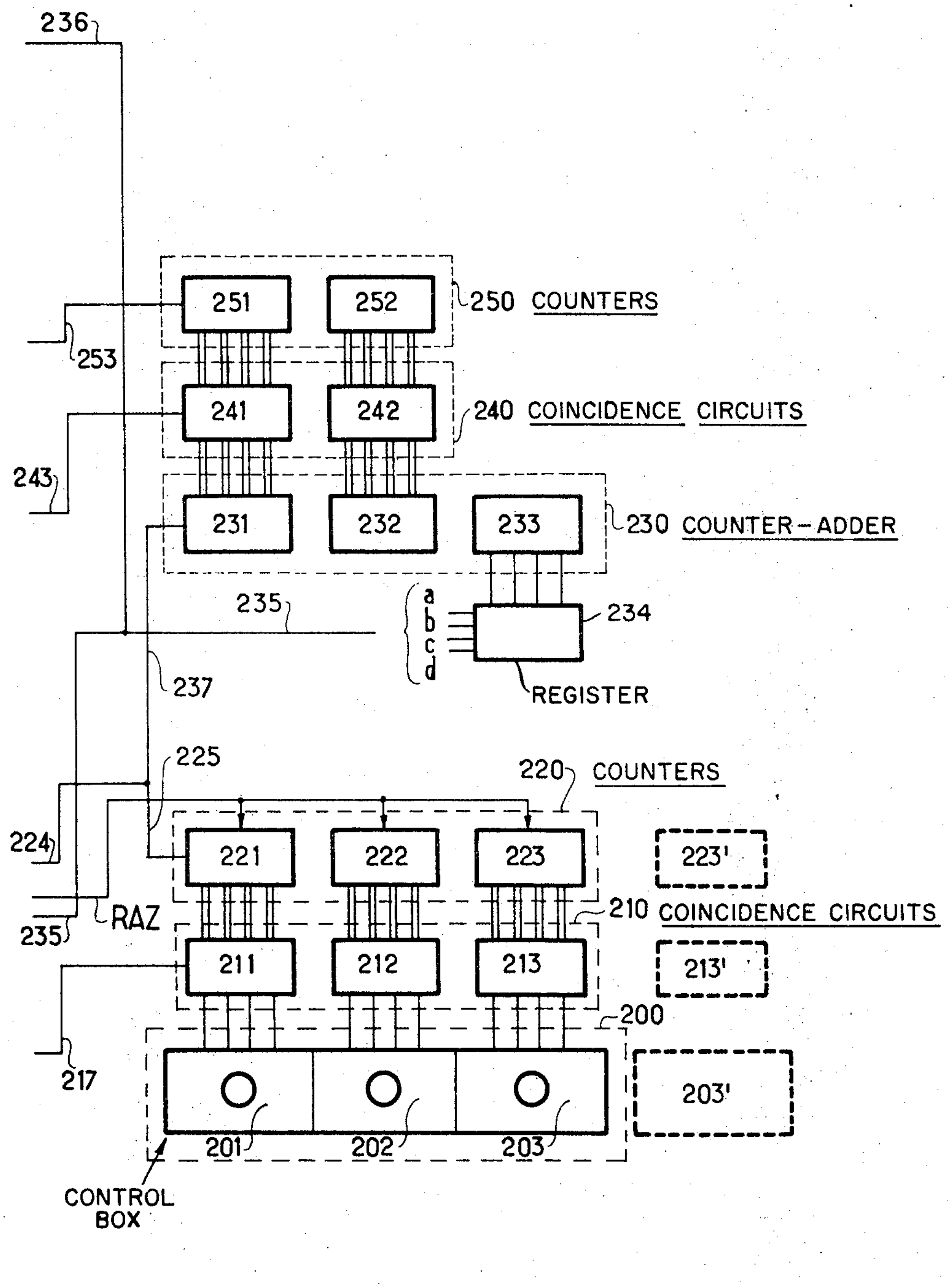

FIGS. 7, 8, and 9 relate to a second embodiment of the invention. In this second embodiment of the invention, a first counter with coincidence counts the clock pulses, and a second counter, during the course of a frequency scanning, counts the pulses of the variable frequency issuing directly from one of the oscillators up to a second coincidence. If at the first coincidence there has been clearing of one of limits of the partial bands of the upper sub-range (40, 50, 60, 70 mHz.), the oscillator is found, as well as the sub-range. If there has not been passing of the limit, one doubles the counting, and if necessary one recounts a further four times or eight times or sixteen times until one of these countings each time doubling the preceding total passes one of the limits the conditions of this last counting allow the apparatus to select automatically the oscillator desired and the desired operator.

In FIG. 7, elements which are common with FIG. 2 have the same reference designation as provided in FIG. 2. One basic difference between the embodiments is that in this embodiment the output signals of the bistable element 17 are applied at the input of the bistable element 90 via a line *p*.

In FIG. 9, there is provided a display control box 200 with three decades, 201, 202, 203, a counter 220 with three decades 221, 222, 223, and a coincidence device 210 with three decades 211, 212, 213. These members have the same structure and the same functions as the members 100, 120, 110, of FIG. 4.

A non-display counter-adder 230 with three decades 231, 232, 233, has an input connected in parallel to the input of the display counter 220. At the decade of the hundreds portion 233, the states 4, 5, 6, 7 can be extracted and transferred to a register 234. The counters 220 and 230 can receive clock pulses via line 224 from clock H (FIG. 8).

Another counter 250 with two decades 251 and 252 displayable by the decades 231 and 232, respectively, via two coincidence circuits 241 and 242, can receive pulses counting the harmonic signals passed by one variable oscillator in the course of one scanning.

From the recorder 234, via the line 236, orders *a*, *b*, *c*, *d* issue which serve to engage one of the oscillators A, B, C, D respectively of FIG. 7 via line A.

In FIG. 8, a switch group 260, with four selective switches 261 to 264 providing four positions 1 to 4, can pass from one position to the other under the control of a logical circuit L.

The device comprises in addition a relay 280 which has single pole switches 281 and 282 and one double pole switch 283; a relay 290 which has a switch 291 and a switch 292; and a relay 270 which has a switch 271 and a switch 272.

A binary counter 190 advances by one unit on each closing of the switch 281. This counter is regulated by means of a coincidence circuit 191 in accordance with values indicated 1, 2, 4, 8, 16 on the contacts of a contactor 192, which can advance from one position to the next under the control of a step by step motor 194. As a function of the position of the said contactor 192, a register 193 makes it possible to select one of the controls I, II, III, IV, V which are connected to the terminals of the same reference in FIG. 7.

The switch 261 of the contactor 260 has its contact 1 connected to a clock pulse generator H, and its sliding contact connected to the switch 282 of the relay 280. The switch 262 has its three contacts 1, 2, 3 connected together to a supply source, indicated symbolically by +, and its sliding contact connected by a line *w* to the relay 30 of FIG. 7. The switch 263 provides one of the orders *a*, *b*, *c*, *d* received at its contact 2 to one of the oscillators A, B, C, D of FIG. 7 via its sliding contact. The switch 264 can receive via its contact 3 the output signals of the flip-flop 17 of FIG. 7 via the line *p*, its sliding contact being connected to the input of the counter 250.

The logical circuit L brings about the shifting of the switch 260 from the position 1 to the position 2 under the influence of the coincidence of the member 210 transmitted by the switch 292. It brings about the passage from the position 2 to the position 3 under the influence of a signal transmitted by one output of the flip-flop 90 via the line *t*. It brings about the passage from the position 3 to the position 4 via a coincidence signal coming from the member 240 (FIG. 9).

In order to make comprehensible the functioning of the apparatus, numerical examples will be taken directly, this method being considered as yielding the best instructions.

It is supposed that the user inscribes on the control box 43.2 mHz. (numerical value 432). At the beginning there is obviously no coincidence signal transmitted by the line 217, the counter 190 indicates the numerical value 1, the contactor 192 indicates the same value 1, the switch group 260 is in position 1. The relay 280 is at rest. On coming to rest, the switch 283 has brought the counter 220 to zero.

The clock pulses are admitted to the counter 220 via the lines 224–225 and to the adder 230 via the lines 224–237. When the counter 220 reaches coincidence the relay 280 becomes operative via lines 217 and 214. At this moment there is coincidence between 190 and 192, which are both at 1. There is a signal at the output of the circuit 191. On reaching 432, the adder 230 has cleared the first limit 400. The result is the operation of the relay 270 by way of the line 235. The relay 270 is accordingly energized and the contact 271 is closed. As a result, the coincidence signal 191 is transmitted to the relay 290, which opens the switch 291.

By reason of the opening of the switch 291, the relay 280 does not bring the counter 220 to zero; the coincidence is therefore maintained. With the switch 272 open there is no energization of the step by step motor 194.

With the switch 292 closed, the coincidence signal transmitted by the line 215 acts on the logical control circuit L to cause the switch group 260 to pass to the position 2. The order I issuing from the register 193 is applied to the terminal of the same indication in FIG. 7. The limit 400 having been cleared in the register 234, to the exclusion of any other, the order *a* is transmitted via the selector switch 263.

The frequency scanning having started at the oscillator A, as soon as the frequency 40 mHz. is cleared, the flip-flop 90 becomes energized and the fine spectrum is engaged by the energization of the relay 40. Simultaneously, a signal transmitted by the line *t* to the logical circuit L causes the switch group 260 to pass to the position 3.

At the position 3 the pulses corresponding to the best signals of the fine spectrum are counted in the counter 250, which requires only two decades since the number of beats (between 40 mHz. and 49.9 mHz., or between 50 and 59.9 mHz. and so on) pertinent to any one of the four oscillators cannot exceed 99. When there is coincidence between the number of beats of the fine spectrum counted (thirty-two) by the two decades of the member 340 (which indicate 32), the counting of the signals is terminated. The line 243 transmits to the logical circuit L an order for shifting the switch group 260, to position 4. By operation of the relay 30, brought back to rest by the line *w*, the scanning stops and the synchronization is set up.

If the control box indicates 639, for example, the process is the same as above. It is the last limit (600) cleared at the moment of the coincidence which is indicated in the register 234.

However, if the control box indicates 272, for example, when there is coincidence at 210, there is no clearing of the limit at 234, since 272 is less than 400. Also the relay 270 remains at rest. The coincidence of 191 is not transmitted by the switch 271 which remains open and the relay 290 remains at rest. With the switch 272 closed, the coincidence signal transmitted by 217–216 causes the step-by-step motor 194 to advance by one cog; contactor 192 thus indicates 2. When on coincidence of 210 transmitted by 217–214, the relay 280 starts working, with the switch 291 closed, counter 220 is brought back to zero. A second counting of the clock pulses begins.

When the second counting of the clock pulses is concluded, the adder 250 indicates 544. The sequence of the process now develops as above, with selection of the oscillator B and of the operator II (division of frequency by 2).

If the control box indicates 160, for example, there is in the first place a first counting which does not supply clearing of the limit. There is accordingly then a second counting, totaling 320, i.e. also without clearing the limit. The contactor 192 then passes to the value 4. The third counting gives 480: there has accordingly been a clearing of the limit 400 but as there is not coincidence of 191 at the end of the third counting (since 192 indicates 4), there is of necessity a fourth counting which gives the total 640. One accordingly has the selection of the oscillator C and of the operator III (division of the frequency by 4).

What has been said in the description of the first embodiment regarding the systematic shifting of one beat to unblock the phase discriminator at the pulse before that last remains valid. One will operate here by bringing back the counter 220 not to zero but to 1.

If one desires a frequency supplied by the synthesizer ($F_s$) different from the carrier frequency ($F_t$), one indicates on the control box, as above, the frequency $F_t$, a particular condition for the return to zero makes it possible to operate the start of the counter 220 at a corrected value. If one wishes a supplied frequency $F_s$ to be less than the indicated value $F_t$, i.e. $F_s=F_t-\Delta F$, one will indicate $\Delta F$ at the beginning of the counting. If one wishes to have a supplied frequency $F_s$ which is greater than the indicated value $F_t$ i.e. $F_s=F_t+\Delta F$, one takes as start position the complement of $\Delta F$, i.e. $(999-\Delta F)$.

If, in the first place, for a high value of $\Delta F$ (greater than 20 mHz.), the traffic frequency exceeds the maximum value which can be indicated 999 (i.e. 99.9 mHz.), one would add to the members 200, 210, 220 a right-hand binary flip-flop, i.e. 203′, 213′, 223′ respectively, which would give the indicating capability up to 1999.

Of course the correction of one beat will be made also in the inscription of $\Delta F$ to opreate the unblocking of the phase discriminator at the beat which presents itself before the desired frequency.

The above description has been given on the basis of electromechanical logic means (relays, commutators and so on) in order to facilitate comprehension of the functioning of the invention. Nevertheless, the preferred embodiment of the apparatus comprises solely electronic logic means which are the transcription, in generally known circuits, of functions illustrated in the description. From the electronic construction one obtains the following advantages: economy in bulk; the complete apparatue occupies a volume less than ½ a cubic decimeter; greater reliability by elimination of mobile mechanical pieces; great functioning speed; and after a fresh indication of the control box, the corresponding frequency is supplied in less than two seconds.

We claim:

1. A wide band frequency synthesizer providing a spectrum of frequencies spaced by a constant quantification step *p* in the form of an automatically functioning high stability generator of a spectrum of fixed frequencies in harmonic interrelationship, including a phase discriminator for providing synchronizing control, comprising oscillator means for providing a basic band of frequencies of relative width *r*, including *m* variable oscillators each having a quantified limit frequency, the intervals between the limit frequencies of the successive oscillation being constant and equal to *kp*, where *k* is an integer, and oscillator selection means for selectively enabling one of said oscillators, arithmetic conversion means connected to said oscillator means for converting said basic band of frequencies to a plurality of subsidiary bands in harmonic relationship with said basic band including *n* operators capable of arithmetically converting the frequency of said oscillators by factors of 1, $r$, $r^2$, $r^3$ . . . $r^n$, thus forming $m \cdot n$ partial bands each of which has a limit frequency characteristic of a specific oscillator and a specific operator, and operator selection means for selectively enabling one of said operators, clock means for generating clock pulses, counting means selectively connected to said clock means for counting said clock pulses, indicator means for indicating a desired frequency by an assigned numerical value, coincidence means for detecting coincidence between the value of said indicator means and the count of said counting means and disabling said clock means in response thereto, registering means connected to said counting means for selecting a particular oscillator and a particular operator appropriate to each numerical value of said counting means by actuation of said oscillator selection means and said operator selection means in response to detection of coincidence by said coincidence means, memory means responsive to said registering means for storing each designation of a limit frequency reached by said counting means including means responsive to said coincidence means for inserting the count stored therein in said counting means, sweep generator means selectively connected to said oscillator means for sweeping the output frequency of one of said oscillators, a first harmonic generator providing harmonics of a reference frequency spaced by a step $p$, modulator means connected to said oscillator means and said first harmonic generator for providing a beat frequency of the varying frequency of the selected oscillator and the output spectrum of the harmonic generator, said beat frequency being applied to said counting means, and logic means for disabling said sweep generator means in response to a coincidence means with said modulator means connected to said counting means.

2. A wide band frequency synthesizer as defined in claim 1 further including a second harmonic generator providing harmonics of said reference frequency spaced by a step $kp$, said logic means including gate means for connecting the output of said second harmonic generator to said modulator means at the beginning of the scanning of said selected oscillator and for connecting the output of said first harmonic generator to said modulator means when said selected oscillator reaches its lower limit frequency.

3. A wide band frequency synthesizer as defined in claim 2 wherein said arithmetic conversion means serves to divide the basic band of frequencies with $r$ being equal to 2.

4. A wide band frequency synthesizer as defined in claim 2 wherein said gate means includes a plurality of additional operators identical to the operators of said arithmetic conversion means and selectively actuated simultaneously therewith, said modulator means being connected to said counting means through said gate means.

5. A wide band frequency synthesizer as defined in claim 2 wherein said registering means comprises a fixed numerical indicator of $mn$ gates connected to a common output controlling said memory means and also having their outputs combined progressively to select an appropriate oscillator and operator in response to a numerical value supplied thereto.

6. A wide band frequency synthesizer as defined in claim 5 wherein the contents of said counting means is selectively gated by relay means to said memory means in response to control signals derived from the common output of said registering means indicative of successive partial frequency bands.

7. A wide band frequency synthesizer as defined in claim 2 further including means for initially setting said counting means to a numerical value 1 rather than 0 so as to initiate the required control over said selected oscillator due to detected coincidence in said coincidence means one pulse prior to actual generation of the desired frequency.

8. A wide band frequency synthesizer as defined in claim 4 further including second logic means for inserting in said additional operators predetermined numerical values corresponding to remainder values.

9. A wide band frequency synthesizer as defined in claim 2 further including a narrow band filter centered on a frequency which is a fraction of the step $p$, said sweep generator means including generator means for generating a saw-tooth voltage having a relatively steep slope up to the time of energization of said filter and generating a saw-tooth voltage having a relatively slight slope in the vicinity of synchronization.

10. A wide band frequency synthesizer as defined in claim 9 wherein said generator means includes a switch circuit and a time constant circuit, the time constant circuit including first blocking means for a transistor in said switch circuit for adjusting the time constant of the generator means in response to a blocking voltage applied from said narrow band filter.

11. A wide band frequency synthesizer as defined in claim 10 wherein said phase discriminator includes a second blocking means response to a blocking voltage from said filter for freeing said phase discriminator to provide control over the selected oscillator.

12. A wide band frequency synthesizer as defined in claim 2 further comprising frequency comparing means connected to the said counting means and said reference frequency for re-enabling said sweep generator means when the received frequencies do not coincide.

13. A wide band frequency synthesizer as defined in claim 12 wherein the output of said frequency comparing means is also connected to means for releasing an alarm a predetermined time after lack of frequency coincidence is detected by said frequency comparing means.

14. A wide band frequency synthesizer as defined in claim 2 further comprising, in addition to said counting means, a counter/adder having a counting input connected in parallel to the input of the said counting means, a register with one decade in interconnection with a decade of the said counter/adder, a second coincidence circuit interconnected with the said counter/adder, as well as a third counter, clock pulses being admissible to the first two counters, the beats between the frequency of one variable oscillator and the harmonic frequencies of a spectrum of one of said harmonic generators at the quantification step to be counted in the said third counter, as well as a counter of the counting cycles, associated with a coincidence circuit, in interconnection with a commutator of positions of repetition of counting of the order of 1, $r$, $r^2$ . . . $r^n$ which can be actuated by a step-by-step motor and is in interconnection with a register serving to define the ranges of the dividers, the repetitions of counting taking place up to the inscription in the counter/adder of a value corresponding to one basic frequency of one of the said $m$ oscillators.

References Cited

UNITED STATES PATENTS 3,287,655 11/1966 Venn et al.

JOHN KOMINSKI, Primary Examiner

U.S. Cl. X.R.

331—18, 22